(12) United States Patent
Guo et al.

(10) Patent No.: US 8,916,405 B2
(45) Date of Patent: Dec. 23, 2014

(54) LIGHT EMITTING DIODE (LED) USING CARBON MATERIALS

(75) Inventors: Dechao Guo, Fishkill, NY (US); Shu-Jen Han, Cortlandt Manor, NY (US); Keith Kwong Hon Wong, Wappingers Falls, NY (US); Jun Yuan, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 138 days.

(21) Appl. No.: 13/270,362

(22) Filed: Oct. 11, 2011

(65) Prior Publication Data

US 2013/0087759 A1 Apr. 11, 2013

(51) Int. Cl.
| | | |
|---|---|---|
| *H01L 21/00* | (2006.01) | |
| *H01L 33/26* | (2010.01) | |
| *H01L 33/00* | (2010.01) | |

(52) U.S. Cl.
CPC ............ *H01L 33/26* (2013.01); *H01L 33/0041* (2013.01)
USPC .................................... 438/42; 257/E33.053

(58) Field of Classification Search
CPC ............ H01L 29/0665; H01L 29/0673; H01L 29/1606; H01L 29/41733; H01L 29/42316; H01L 29/42356; H01L 29/45; H01L 29/4908; H01L 51/0048; H01L 51/5262
USPC .......... 257/13, E33.053, E29.005; 438/22, 42
See application file for complete search history.

(56) References Cited

U.S. PATENT DOCUMENTS

| | | | |
|---|---|---|---|
| 7,115,916 B2 | 10/2006 | Avouris et al. | |
| 7,495,252 B2 | 2/2009 | Ahn et al. | |
| 7,652,280 B2 | 1/2010 | Li et al. | |
| 7,687,876 B2 | 3/2010 | Kabir | |
| 2004/0075124 A1* | 4/2004 | Wu et al. | 257/288 |
| 2005/0170648 A1* | 8/2005 | Tsai et al. | 438/687 |
| 2006/0105523 A1* | 5/2006 | Afzali-Ardakani et al. | 438/257 |
| 2006/0278934 A1* | 12/2006 | Nagahama | 257/369 |
| 2008/0246151 A1* | 10/2008 | Yang et al. | 257/751 |
| 2008/0261368 A1* | 10/2008 | Ramin et al. | 438/287 |
| 2008/0273280 A1 | 11/2008 | Chen et al. | |
| 2009/0267053 A1 | 10/2009 | Peng et al. | |
| 2009/0291534 A1* | 11/2009 | Li et al. | 438/151 |
| 2010/0051960 A1* | 3/2010 | Chen et al. | 257/76 |
| 2010/0127241 A1 | 5/2010 | Gruner et al. | |
| 2011/0053321 A1* | 3/2011 | Huang | 438/127 |
| 2011/0089995 A1* | 4/2011 | Heo et al. | 327/534 |

OTHER PUBLICATIONS

A. Javey et al., "Carbon Nanotube Field-Effect Transistors with Integrated Ohmic Contacts and High-k Gate Dielectrics," Nano Letters, vol. 4, No. 3, pp. 447-450 (2004).

T. Mueller et. al, "Efficient narrow-band light emission from a single carbon nanotube p-n diode," Nature Nanotechnology, vol. 5, pp. 27-31 (2009).

P. Avouris et al., "Progress in Carbon Nanotube Electronics and Photonics," MRS Bulletin, vol. 35, pp. 306-313 (Apr. 2010).

* cited by examiner

*Primary Examiner* — Duy T Nguyen
(74) *Attorney, Agent, or Firm* — Vazken Alexanian; Michael J. Chang, LLC

(57) ABSTRACT

Carbon-based light emitting diodes (LEDs) and techniques for the fabrication thereof are provided. In one aspect, a LED is provided. The LED includes a substrate; an insulator layer on the substrate; a first bottom gate and a second bottom gate embedded in the insulator layer; a gate dielectric on the first bottom gate and the second bottom gate; a carbon material on the gate dielectric over the first bottom gate and the second bottom gate, wherein the carbon material serves as a channel region of the LED; and metal source and drain contacts to the carbon material.

14 Claims, 4 Drawing Sheets

METAL CONTACT FOR SOURCE/DRAIN

POLY-Si EMBEDDED GATE

POLY-Si EMBEDDED GATE

LIGHT EMITTING DIODE (LED) USING CARBON MATERIALS

FIELD OF THE INVENTION

The present invention relates to light emitting diodes (LEDs) and more particularly, to carbon-based LEDs and techniques for the fabrication thereof.

BACKGROUND OF THE INVENTION

Light emission from single carbon nanotube p-n diodes using electrostatic doping has been demonstrated. See, for example, T. Mueller et. al, "Efficient narrow-band light emission from a single carbon nanotube p-n diode," Nature nanotech, 5, pgs. 27-31 (2009) (hereinafter "Mueller"). Thus, light emitting diodes (LED) based on carbon materials can be the key building block for future nanometer-scale light sources.

The device structure described in Mueller is top-gated and employs an aluminum oxide gate dielectric. There are however some notable drawbacks associated with this type of structure. First, the use of a top-gated structure reduces the overall efficiency of the device since the gates will cover, and thus block, light emission from the device. Second, the quality of the dielectrics employed is poor due to the difficulties associated with forming high-quality gate dielectrics on carbon materials. Specifically, the carbon materials provide an inert surface onto which the gate dielectrics are to be deposited. Deposition of a high quality gate dielectric, such as a high-k dielectric, on an inert surface is very difficult. Either some seed layer needs to be first coated on the carbon material to promote further high-k dielectric deposition, or a very thick dielectric has to be used. These methods however lead to either severe mobility degradation or non-scalable dielectric thickness. Thus, the result is a non-ideal electrostatic.

Therefore, a carbon material (i.e., carbon nanotube)-based LED device structure that does not suffer from the above-described drawbacks and techniques for the fabrication thereof, would be desirable.

SUMMARY OF THE INVENTION

The present invention provides carbon-based light emitting diodes (LEDs) and techniques for the fabrication thereof. In one aspect of the invention, a LED is provided. The LED includes a substrate; an insulator layer on the substrate; a first bottom gate and a second bottom gate embedded in the insulator layer; a gate dielectric on the first bottom gate and the second bottom gate; a carbon material on the gate dielectric over the first bottom gate and the second bottom gate, wherein the carbon material serves as a channel region of the LED; and metal source and drain contacts to the carbon material.

In another aspect of the invention, a method of fabricating a LED is provided. The method includes the following steps. A substrate is provided. An insulator layer is formed on the substrate. A first bottom gate and a second bottom gate are formed embedded in the insulator layer. A gate dielectric is deposited on the first bottom gate and the second bottom gate. A carbon material is deposited on the gate dielectric over the first bottom gate and the second bottom gate, wherein the carbon material serves as a channel region of the LED. Metal source and drain contacts are formed to the carbon material.

A more complete understanding of the present invention, as well as further features and advantages of the present invention, will be obtained by reference to the following detailed description and drawings.

DETAILED DESCRIPTION OF PREFERRED EMBODIMENTS

Figure 1:
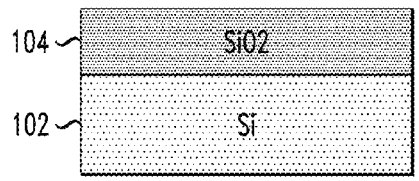
FIG. 1 is a cross-sectional diagram illustrating a starting structure for a light emitting diode (LED) fabrication process that includes a silicon (Si) substrate and an insulator layer formed on the substrate according to an embodiment of the present invention.

Provided herein are carbon-based light emitting diodes (LEDs) and techniques for the fabrication thereofIG. 1 is cross-sectional diagram illustrating a starting structure for the fabrication process. As shown in FIG. 1 a substrate 102 is provided. According to an exemplary embodiment, substrate 102 is a silicon (Si) substrate. However, any other suitable substrate material may be employed in the same manner. By way of example only, bulk germanium (Ge) or silicon germanium (SiGe) wafers may also be used as the substrate. Alternatively, glass or plastic substrates may also be used.

Next, an insulator layer 104 is formed (deposited or grown) on substrate 102. According to an exemplary embodiment, insulator layer 104 is formed from an oxide material, such as silicon dioxide ($SiO_2$), that is deposited on substrate 102 using chemical vapor deposition (CVD) to a thickness of from about 10 nanometers (nm) to about 1,000 nm, e.g., from about 100 nm to about 500 nm. Alternatively, when the substrate 102 is formed from a semiconductor material, such as Si, Ge or SiGe as described above, the insulator layer 104 can be grown on the substrate 102 using an oxidation process, such as thermal oxidation. By way of example only, when the substrate 102 is formed from Si, then the insulator layer 104 formed by thermal oxidation would be $SiO_2$. According to the exemplary embodiment wherein the insulator layer 104 is formed from a thermal oxide, the insulator layer can have a thickness of from about 50 nm to about 2,000 nm, e.g., from about 100 nm to about 1,000 nm.

As will be described in detail below, trenches will be etched in the insulator layer 104 that extend part way through the layer. To facilitate the etching process, it might be preferable to instead employ a bilayer insulator layer configuration (i.e., wherein the insulator layer 104 is actually composed of two different materials). According to this exemplary alternative embodiment, the insulator layer 104 can be formed by depositing a first insulating layer on the substrate 102 and then depositing a second insulating layer on the first insulating layer. The first insulating layer and the second insulating layer will together form the insulating layer 104a (see FIG. 1A). In this case, the insulating layer is given the reference numeral 104a so as to distinguish it from the single layer insulating layer embodiment shown in FIG. 1.

The idea behind this bi-layer insulating layer embodiment is that the trenches (to be formed later in the process) can be formed selectively through the top insulating layer (in this case the second insulating layer), stopping on the bottom insulating layer (in this case the first insulating layer). Since, as highlighted above, the trenches will extend only part way through the insulating layer, this bi-layer configuration makes etching the trenches easier, and in some cases more precise than with the single insulating layer embodiment (of FIG. 1). Thus, the first/second insulating materials should be selected so as to permit etch selectivity between the two materials.

Two insulating materials that provide the desired etch selectivity are oxide and nitride materials. Thus, according to an exemplary embodiment, the first insulating layer is formed from a nitride material, such as silicon nitride ($Si_3N_4$), that is deposited on the substrate 102 using CVD. By way of example only, the first insulating layer is deposited onto the substrate 102 to a thickness of from about 50 nm to about 500 nm, e.g. from about 100 nm to about 300 nm. In this exemplary embodiment, the second insulating layer is formed from an oxide material, such as $SiO_2$, that is deposited on the first insulating layer also using CVD. By way of example only, the second insulating layer is deposited onto the first insulating layer to a thickness of from about 50 nm to about 500 nm, e.g. from about 100 nm to about 300 nm.

Figure 1A:
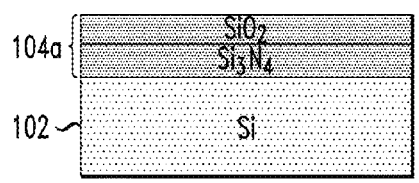
FIG. 1A is a cross-sectional diagram illustrating an alternative starting structure for the LED fabrication process that includes a Si substrate and a bilayer insulator layer formed on the substrate according to an embodiment of the present invention.

This configuration is shown illustrated in FIG. 1A. Accordingly, to etch trenches that extend part way through the insulator layer 104 is then easily accomplished using an oxide-selective etch (such as an oxide-selective reactive ion etching (RIE)) to etch the oxide portion of the bilayer insulator using the underlying nitride portion of the bilayer insulator as an etch stop (see below).

Figure 2:
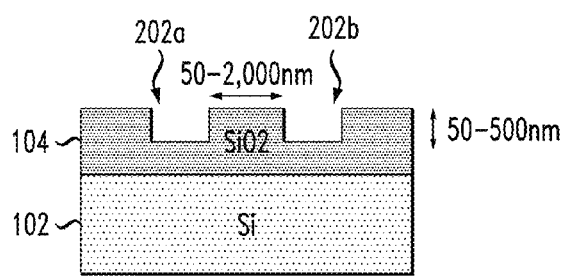
FIG. 2 is a cross-sectional diagram illustrating trenches having been patterned in the insulator layer of FIG. 1 according to an embodiment of the present invention.

At least two trenches 202a and 202b are then formed adjacent to one another in insulator layer 104. See FIG. 2. As shown in FIG. 2, the trenches 202a and 202b extend part way through the insulator layer 104. This configuration ensures electrical isolation between the gates which will be formed in the trenches later on in the process.

Figure 2A:
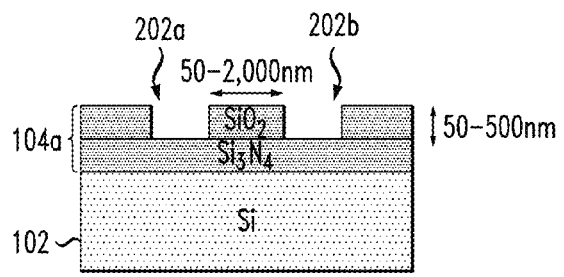
FIG. 2A is a cross-sectional diagram illustrating trenches having been patterned in the bilayer insulator layer of FIG. 1A according to an embodiment of the present invention.

According to an exemplary embodiment, trenches 202a and 202b each have a depth of from about 50 nm to about 500 nm, e.g., from about 100 nm to about 300 nm in the insulator layer 104, and are spaced apart from one another by a distance of from about 50 nm to about 2,000 nm, e.g., from about 100 nm to about 1,000 nm (see, e.g., FIG. 2). According to an exemplary embodiment, trenches 202a and 202b are patterned as lines in the insulating layer 104 (or 104a, see FIG. 2A). These lines would not be visible in the cross-sectional depiction shown in the figures, but it would be apparent to one of ordinary skill in the art how patterned lines would appear. In that case, the patterned lines would preferably be formed parallel to one another.

Trenches 202a and 202b may be formed using standard lithography and etching processes. By way of example only, a patterned hardmask may first be formed on the insulating layer 104. The patterning of the hardmask will correspond to the footprint and location of the trenches 202a and 202b. A dry etching process, such as RIE, can then be used to pattern the trenches 202a and 202b. Any remaining hardmask after the RIE step can then be removed, e.g., by etching.

When, as described above, the insulator layer 104 is composed of a single layer, such as single $SiO_2$ layer, a timed etch can be used to achieve the proper depth of the trenches 202a and 202b in the (single layer) insulator layer 104. Since the trenches 202a and 202b would in this case be patterned in the same RIE step, these trenches would naturally have approximately the same depth (e.g., ±1 nm).

Alternatively, when as described above a bilayer insulator layer 104a is employed, then an etch selective for the upper layer (the second insulating layer in the example above) may be employed to achieve the desired depth of the trenches 202a and 202b in the insulator layer 104a. In the case of a bilayer insulator layer 104a having an oxide layer over a nitride layer, an oxide-selective RIE etch may be performed to etch the trenches 202a and 202b in the oxide layer using the nitride layer as an etch stop. In this case, the depth of the trenches would be commensurate with the thickness of the oxide layer portion of the bilayer insulator layer. This configuration is shown illustrated in FIG. 2A. The remainder of the process will be illustrated by way of reference to the embodiment employing a single material insulator layer 104 (i.e., that of FIGS. 1 and 2) with the understanding that, from this point forward in the process, the exact same steps would be employed in the case of a bilayer insulator.

Figure 3:
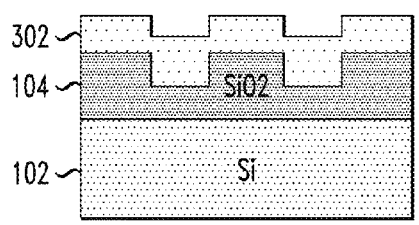
FIG. 3 is a cross-sectional diagram illustrating a gate material having been deposited over the structure filling the trenches according to an embodiment of the present invention.

A gate material 302 is then blanket deposited over the structure, filling trenches 202a and 202b. See FIG. 3. Suitable gate materials include, but are not limited to, polysilicon, a metal (such as a TaN, TiN, W, or aluminum) or a combination of metals (such as TiN/Al). Polysilicon may be deposited using a CVD process, such as low-pressure CVD (LPCVD) or plasma-enhanced CVD (PECVD). Metal gate materials may be deposited using e-beam evaporation, a physical vapor deposition (PVD), atomic layer deposition (ALD) or an electroplating process. When multiple metals are employed, the metals can be deposited as separate layers in a stack or as an alloy.

Figure 4:
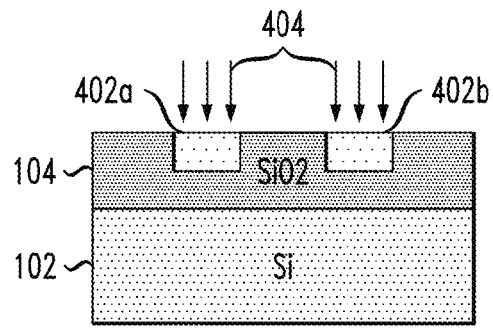
FIG. 4 is a cross-sectional diagram illustrating the gate material having been polished down to the surface of the oxide layer resulting in bottom gates embedded in the insulator layer (and an ion implantation when poly-silicon (poly-Si) is used as the gate material) according to an embodiment of the present invention.

Next, the gate material 302 is polished down to the surface of insulator layer 104, e.g., using chemical-mechanical polishing (CMP) or other suitable etching process. The result is a pair of either metal or polysilicon bottom gates 402a and 402b of the device embedded in the insulator layer 104. See FIG. 4. When polysilicon is used as the gate material, an additional ion implantation step is needed to dope the polysilicon. This step is shown illustrated by arrows 404 in FIG. 4. Suitable dopants for the implantation step include, but are not limited to, arsenic (As), boron (B) and phosphorus (P). This is a maskless process since each of the (in this case polysilicon) bottom gates 402a and 402b will receive the same dopant.

The ion implantation process parameters would be apparent to one of skill in the art. No ion implantation is needed when a metal gate material is being employed.

To form an LED, electrostatic doping will be used to form an n-gate and a p-gate. Specifically, during operation of the device, bottom gates 402a and 402b will each be biased at a different gate voltage, e.g., Vg1 and Vg2, respectively, which electrically dopes the overlaying carbon channel to become n-type or p-type. See, for example, FIG. 8, described below. An p-type/n-type LED is the result.

Advantageously, the use of a bottom-gated structure in the present techniques prevents the gates from covering and blocking light emission from the device. As described above, with conventional configurations, the gates are positioned such that light emission from the device is at least partially blocked by the gates thus reducing the overall device efficiency.

Figure 5:
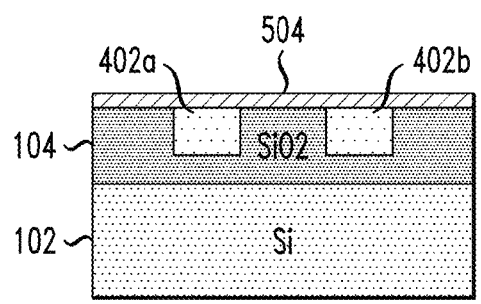
FIG. 5 is a cross-sectional diagram illustrating a gate dielectric having been deposited on the bottom gates according to an embodiment of the present invention.
Figure 6:
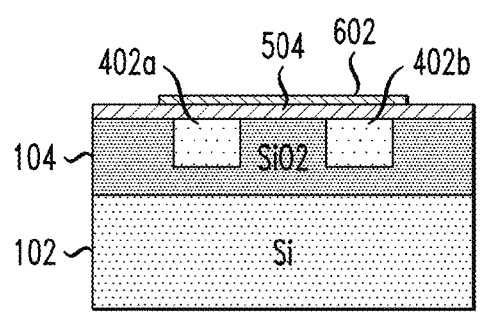
FIG. 6 is a cross-sectional diagram illustrating a carbon material having been deposited on the gate dielectric according to an embodiment of the present invention.

A gate dielectric 504 is then deposited on the bottom gates 402a and 402b and at least a portion of insulator layer 104. See FIG. 5. The gate dielectric will separate the bottom gates 402a and 402b from a (carbon-based) channel of the device (see FIG. 6, described below). According to an exemplary embodiment, the gate dielectric 504 is composed of a high-K dielectric material, such as hafnium oxide ($HfO_2$), aluminum oxide ($Al_2O_3$) or $Si_3N_4$ and is deposited on the bottom gates 402a and 402b using CVD or ALD.

Advantageously, with the present techniques a higher quality dielectric (as compared to conventional top-gated designs) can be formed since the above-described problems associated with forming a dielectric on a carbon material are avoided. Namely, since the carbon material will be deposited/transferred (see below) onto an already formed gate/gate dielectric structure, then issues related to depositing dielectric materials onto the carbon material are altogether avoided.

A carbon material 602 is then deposited on the gate dielectric 504 over the bottom gates 402a and 402b (i.e., the gate dielectric 504 separates the carbon material 602 from the bottom gates 402a and 402b). See FIG. 6. According to an exemplary embodiment, the carbon material 602 is made up of carbon nanotubes. As is known in the art, carbon nanotubes are allotropes of carbon having a cylindrical structure. Either single-walled or multi-walled carbon nanotubes may be employed in accordance with the present techniques. Carbon nanotubes can be randomly dispersed onto the gate dielectric 504 or can be deposited onto the gate dielectric 504 using a transfer process as is known in the art.

Alternatively, the carbon material can be made up of graphene. As is known in the art, graphene is an allotrope of carbon with a structure resembling a honeycomb configuration. A graphene sheet or sheets can be deposited onto the gate dielectric 504 using a transfer process, such as exfoliation.

The carbon material 602 will serve as a channel region of the device. If necessary, the carbon material 602 can be patterned. For example, if a transfer process is used, the length of the transferred carbon nanotube film is typically greater than 10 micrometers (μm) (and can sometimes be as long as 200 μm). Films of this dimension might electrically short adjacent devices if the film is not patterned. The desired dimensions, of course, depend on the particular device at hand.

Standard patterning processes may be employed to pattern the carbon material 602. By way of example only, patterned photoresist can be used to protect the carbon material 602 within the channel region (i.e., the region above the gates). An oxygen ($O_2$) plasma can then be used to etch away the exposed carbon nanotubes.

Figure 7:
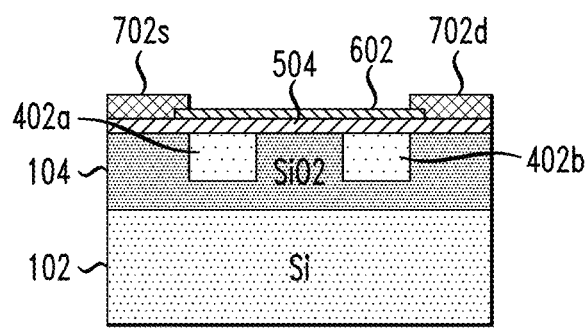
FIG. 7 is a cross-sectional diagram illustrating source and drain metal contacts having been formed to the carbon material according to an embodiment of the present invention.

Source and drain metal contacts 702s and 702d are then formed to the carbon material 602. See FIG. 7. According to an exemplary embodiment, contacts 702s and 702d are formed by first depositing a metal or metals and then patterning the metal(s) into contacts 702s and 702d. Suitable metals for use in forming contacts 702s and 702d include, but are not limited to, titanium (Ti). The contact metal may be deposited using, for example, e-beam evaporation. By way of example only, the contact metal may be patterned using a lift-off patterning process. Lift-off patterning techniques are known to those of skill in the art. In general however, lift-off patterning involves first forming a mask covering areas on which deposition of the metal is not desired. The metal is then deposited through the mask such that when the mask is removed, the metal on the mask is also removed. Fabrication of the LED device is now complete.

Figure 8:
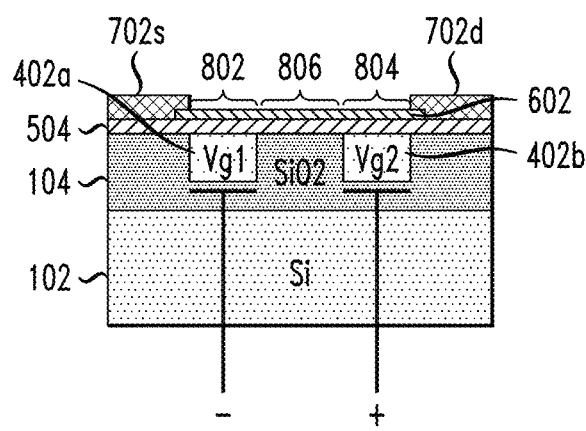
FIG. 8 is a cross-sectional diagram illustrating that during operation of the device, the bottom gates will each be biased at a different gate voltage which electrically dopes the overlaying carbon channel to become n-type or p-type according to an embodiment of the present invention.

As shown in FIG. 8, during operation of the device, bottom gates 402a and 402b will each be biased at a different gate voltage, e.g., Vg1 and Vg2, respectively, which electrically dopes the overlaying carbon channel to become n-type or p-type. According to an exemplary embodiment, Vg1 is a negative gate voltage and Vg2 is a positive gate voltage, or vice-a-versa. Because there are two gates with different gate biases, a region 802 of the carbon material 602 on top of the gate with the negative gate voltage (bottom gate 402a in FIG. 8) will become p-doped (p region) (hole carrier dominates) and a region 804 of the carbon material 602 on top of the gate with the positive gate voltage (bottom gate 402b in FIG. 8) will be n-doped (n region) (electron dominates). An ungated region 806 of the carbon material 602 (i.e., a portion under which no gate is present) will become an intrinsic region (i region). The result is a p-i-n diode. When the diode is biased under forward bias condition, electron and hole will start to recombine (mostly in the intrinsic region) and light emission will occur.

Figure 9A:
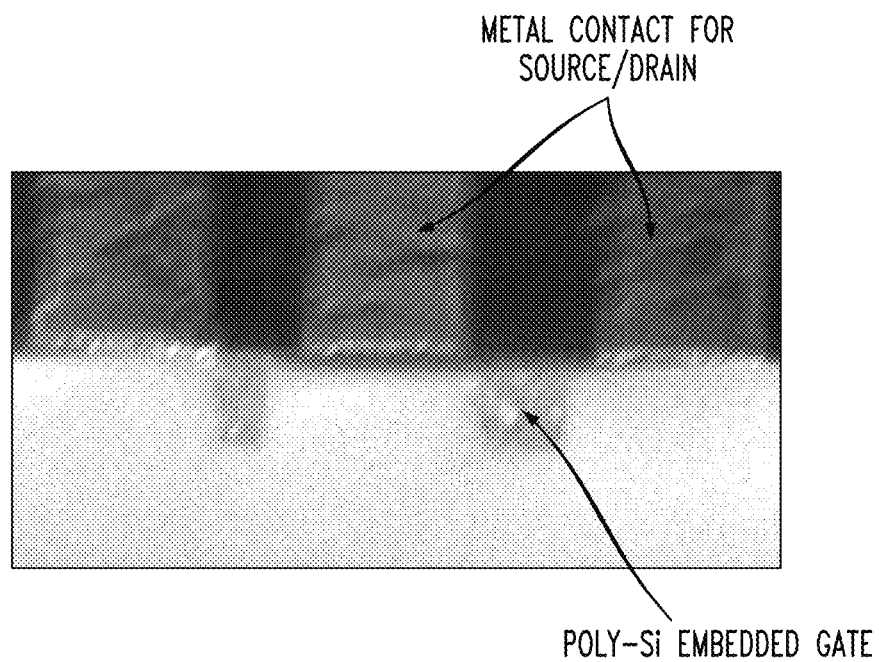
FIG. 9a is an image taken of an LED device fabricated using the present techniques having a poly-Si bottom gate and metal source and drain contacts according to an embodiment of the present invention.
Figure 9B:
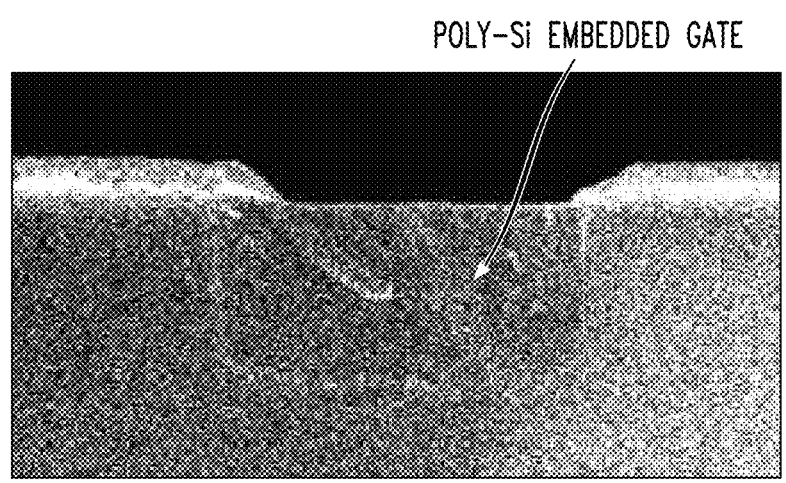
FIG. 9b is an image which provides a close-up view of the present poly-Si bottom gate structure according to an embodiment of the present invention.

FIG. 9a is an image taken of an LED device fabricated using the present techniques. FIG. 9a illustrates the poly-Si bottom gated structure and metal source and drain contacts. FIG. 9b is an image which provides a more close-up view of the poly-Si bottom gate.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a LED, comprising the steps of:
    providing a substrate;
    forming an insulator layer on the substrate, wherein the insulator layer has a bilayer configuration;
    after the insulator layer has been formed on the substrate, forming a first bottom gate and a second bottom gate embedded in the insulator layer such that the first bottom gate and the second bottom gate extend only part way through the insulator layer and a portion of the insulator layer separates the first bottom gate and the second bottom gate from the substrate;
    depositing a gate dielectric on the first and second bottom gates;
    depositing a carbon material directly on the gate dielectric over the first bottom gate and the second bottom gate, wherein the carbon material as deposited covers only a portion of the gate dielectric and serves as a channel region of the LED; and
    forming metal source and drain contacts directly on the gate dielectric and which cover a portion of, and are in contact with, the carbon material.

2. The method of claim 1, wherein the step of forming the first bottom gate and the second bottom gate embedded in the insulator layer comprises the steps of:

forming a first trench and a second trench that each extends only part way through the insulator layer, wherein the first trench and the second trench are formed in the insulator layer by etching the insulator layer through a patterned hardmask;

filling the first trench and the second trench with a gate material; and polishing the gate material down to a surface of the insulator layer.

3. The method of claim 2, wherein the gate material comprises at least one metal.

4. The method of claim 2, wherein the gate material comprises polysilicon, the method further comprising the step of:

performing an ion implant into the gate material to dope the polysilicon.

5. The method of claim 1, wherein the gate dielectric is deposited on the first bottom gate and the second bottom gate using chemical vapor deposition or atomic layer deposition.

6. The method of claim 1, wherein the carbon material comprises carbon nanotubes.

7. The method of claim 6, wherein the carbon nanotubes are deposited on the gate dielectric using a transfer process.

8. The method of claim 1, wherein the carbon material comprises graphene.

9. The method of claim 1, wherein the step of forming the metal source and drain contacts to the carbon material comprises the steps of:

depositing a metal on the carbon material; and patterning the metal to form the metal source and drain contacts.

10. The method of claim 1, wherein the metal source and drain contacts comprise titanium.

11. The method of claim 9, wherein the metal is deposited on the carbon material using e-beam evaporation.

12. The method of claim 1, further comprising the step of:

patterning the carbon material by i) using a patterned photoresist to protect the carbon material within the channel region of the LED and ii) using an oxygen plasma to etch away exposed carbon material.

13. The method of claim 1, wherein the insulator layer comprises i) a nitride layer deposited directly on the substrate, and ii) an oxide layer deposited directly on a side of the nitride layer opposite the substrate.

14. The method of claim 13, wherein the step of forming the first bottom gate and the second bottom gate embedded in the insulator layer comprises the steps of:

forming a first trench and a second trench that each extends through the oxide layer and stop on the nitride layer such that the first trench and the second trench each extend only part way through the insulator layer, wherein the first trench and the second trench are formed in the oxide layer by etching the oxide layer using an oxide-selective etch through a patterned hardmask;

filling the first trench and the second trench with a gate material; and polishing the gate material down to a surface of the insulator layer.

* * * * *